US009209046B2

(12) United States Patent
Liu et al.

(10) Patent No.: US 9,209,046 B2
(45) Date of Patent: Dec. 8, 2015

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Yu-Chih Liu, Taipei (TW); Chang-Chia Huang, Hsinchu (TW); Shih-Yen Lin, New Taipei (TW); Chin-Liang Chen, Kaohsiung (TW); Kuan-Lin Ho, Hsinchu (TW); Wei-Ting Lin, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/044,490

(22) Filed: Oct. 2, 2013

(65) Prior Publication Data

US 2015/0093856 A1 Apr. 2, 2015

(51) Int. Cl.
*H01L 21/00* (2006.01)
*H01L 21/56* (2006.01)
*H01L 23/31* (2006.01)

(52) U.S. Cl.
CPC ............ *H01L 21/561* (2013.01); *H01L 21/563* (2013.01); *H01L 23/3135* (2013.01); *H01L 2225/06586* (2013.01); *H01L 2225/06589* (2013.01); *H01L 2225/1094* (2013.01)

(58) Field of Classification Search
CPC .................. H01L 2924/0002; H01L 21/568; H01L 21/6835; H01L 2221/6834; H01L 25/50; H01L 21/563; H01L 2225/06586; H01L 2225/06589; H01L 2225/1094; H01L 2924/3511

See application file for complete search history.

(56) References Cited

U.S. PATENT DOCUMENTS

| 5,175,007 | A | * | 12/1992 | Elliott ........................ 425/129.1 |
|---|---|---|---|---|
| 5,904,502 | A | * | 5/1999 | Ference ........................ 438/118 |
| 8,426,256 | B2 | * | 4/2013 | Hsiao et al. .................. 438/126 |
| 2006/0211218 | A1 | * | 9/2006 | Boyle et al. ................... 438/455 |
| 2007/0216004 | A1 | * | 9/2007 | Brunnbauer et al. ......... 257/678 |
| 2008/0224296 | A1 | * | 9/2008 | Meyer et al. .................. 257/687 |
| 2010/0078858 | A1 | * | 4/2010 | Nishikawa .................... 264/427 |
| 2010/0109169 | A1 | * | 5/2010 | Kolan et al. ................... 257/787 |
| 2010/0127409 | A1 | * | 5/2010 | Jiang et al. .................... 257/783 |

(Continued)

FOREIGN PATENT DOCUMENTS

WO WO 2010/080068 7/2015

OTHER PUBLICATIONS

Office Action and Search Report issued by Taiwan Intellectual Property Office on Sep. 22, 2015 for counterpart Taiwan application 103112792.

(Continued)

*Primary Examiner* — Brett Feeney
*Assistant Examiner* — Sophia Nguyen
(74) *Attorney, Agent, or Firm* — WPAT, P.C.; Anthony King

(57) ABSTRACT

A method of manufacturing a WLP semiconductor structure includes several operations. One of the operations is providing a carrier and the carrier includes a top surface. One of the operations is covering a portion of the top surface with a plurality of active dies. One of the operations is disposing a protrudent band on a periphery of the carrier, wherein the protrudent band includes a rim shaped along the contour of the carrier. One of the operations is forming a molding compound on the carrier to cover the plurality of active dies.

15 Claims, 18 Drawing Sheets

(56) References Cited

U.S. PATENT DOCUMENTS

| | | | |
|---|---|---|---|
| 2010/0167471 A1* | 7/2010 | Jin et al. | 438/127 |
| 2010/0225011 A1* | 9/2010 | Lee et al. | 257/797 |
| 2010/0248427 A1* | 9/2010 | Wu et al. | 438/118 |
| 2010/0279463 A1* | 11/2010 | Hsiao et al. | 438/107 |
| 2011/0291138 A1* | 12/2011 | Hsieh et al. | 257/98 |
| 2012/0027950 A1* | 2/2012 | Wakamatsu et al. | 427/553 |
| 2012/0064673 A1* | 3/2012 | Fuergut et al. | 438/127 |
| 2012/0106137 A1* | 5/2012 | Scott et al. | 362/147 |
| 2012/0126395 A1* | 5/2012 | Lee et al. | 257/737 |
| 2012/0135096 A1* | 5/2012 | Maeyama et al. | 425/130 |
| 2012/0187568 A1* | 7/2012 | Lin et al. | 257/774 |
| 2012/0193779 A1* | 8/2012 | Lee et al. | 257/737 |
| 2013/0037990 A1* | 2/2013 | Lin et al. | 264/272.17 |
| 2013/0087916 A1* | 4/2013 | Lin et al. | 257/738 |
| 2013/0087951 A1* | 4/2013 | Lin et al. | 264/490 |
| 2013/0115735 A1* | 5/2013 | Chen et al. | 438/108 |
| 2013/0320572 A1* | 12/2013 | Chang et al. | 257/787 |
| 2013/0344627 A1* | 12/2013 | Kim et al. | 438/15 |
| 2015/0061162 A1* | 3/2015 | Yu et al. | 257/787 |
| 2015/0093858 A1* | 4/2015 | Hwang et al. | 438/113 |
| 2015/0162258 A1* | 6/2015 | Hsu et al. | 257/787 |

OTHER PUBLICATIONS

English translationo of the Search Report issued by Taiwan Intellectual Property Office on Sep. 22, 2015 for counterpart Taiwan application 103112792.

US2010/0109169 is the US counterpart of WO2010/080068.

* cited by examiner

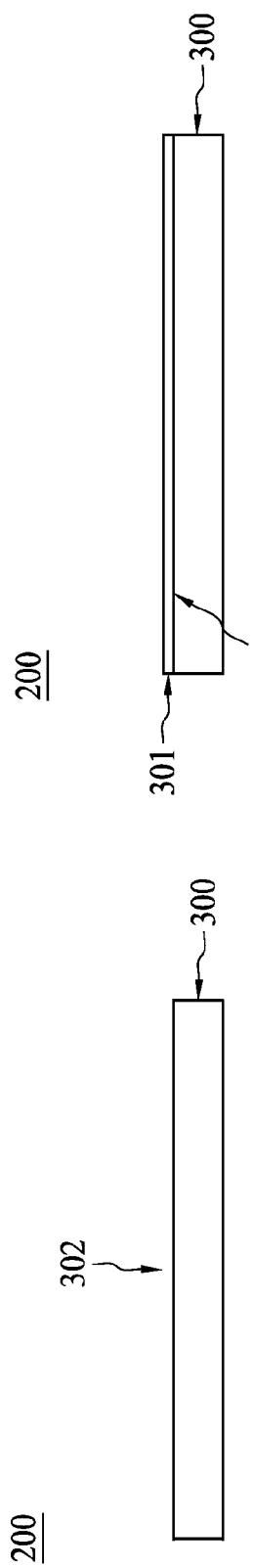
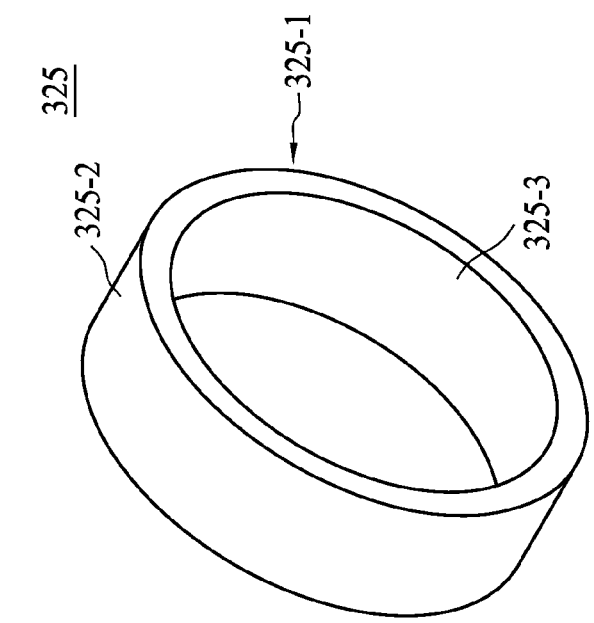
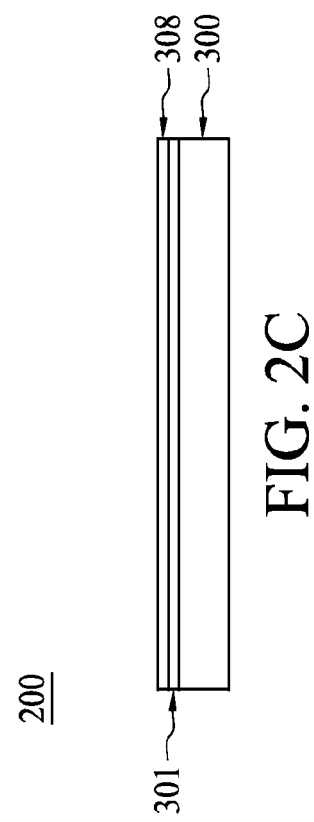
FIG. 2A
FIG. 2B
FIG. 2C
FIG. 2D

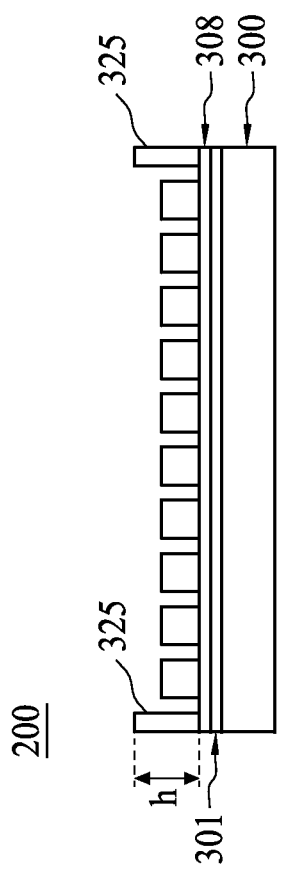

SEMICONDUCTOR DEVICE AND MANUFACTURING METHOD THEREOF

FIELD

The disclosure relates to a structure, and more particularly to a semiconductor device and a manufacturing method of the semiconductor device.

BACKGROUND

Presently, the electronic equipments are indispensable from everyone's daily life. Consumers increasingly demand more processing power, lower electrical power usage and cheaper devices. As the electronic industry strive to meet these demands, miniaturization, resulting in more complicated and denser configurations, extends the number of chips per wafer, the number of transistors per chip, and reduces power usage. As the electronic components are made lighter, smaller, more multifunctional, more powerful, more reliable and less expensive, a wafer level packaging (WLP) technology has been gaining in popularity. The WLP technology combines dies having different functionalities at a wafer level, and is widely applied in order to meet continuous demands toward the miniaturization and higher functions of the electronic components.

The WLP technology adopts several operations to form a structure that includes multiple layers of different materials stacking on a wafer. In contrast to a traditional packaging technology, the WLP technology is crafted in a greater scale and more complicated working environment. Some factors, such as the uniformity within the wafer is critical for each layer disposed on the wafer. An undesirable offset may lead to a malfunction of a to-be-singulated integrated circuit.

As the size of the wafer used in the WLP technology becomes greater, there are more challenges to the yield of the manufacturing. As such, improvements in the structure and method for a WLP continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2I are illustrations of a semiconductor device in various stages corresponding to the method of FIG. 1 in accordance with some embodiments of the present disclosure.

DETAILED DESCRIPTION OF THE INVENTION

Figure 1:
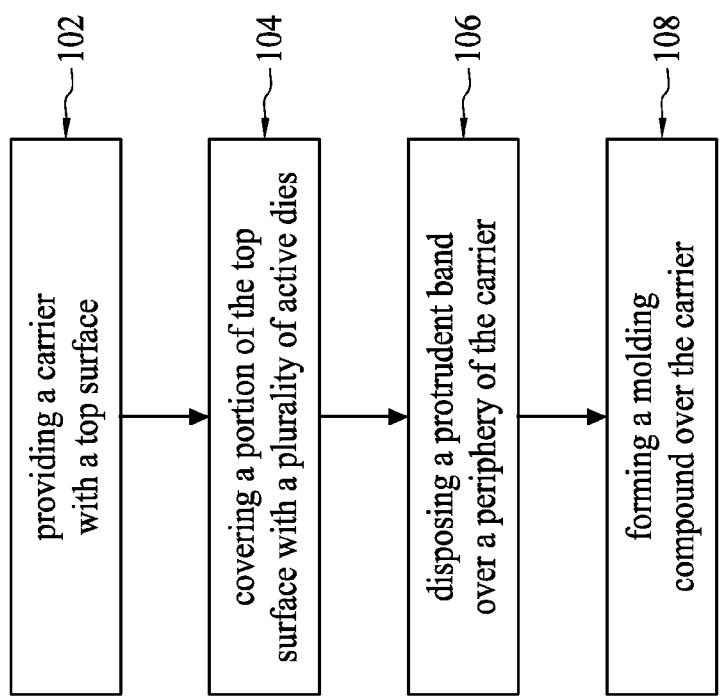
FIG. 1 is a flow diagram of a method of manufacturing a semiconductor device in accordance with some embodiments of the present disclosure.

The manufacturing and use of the embodiments are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a term "carrier" is referred to a substrate used to carry some semiconductor dies (called dies hereinafter) or other components in a WLP (wafer level package) process. Shape of the carrier is circular, polygonal or other suitable designs. Material of the carrier is silicon, glass, silicon carbide, or other suitable substance. In some embodiments, the carrier includes a silicon or glass wafer in a circular shape.

A top surface of the carrier is a surface provided for die placing and molding compound disposing. Additionally, some metallization structures such as redistribution layer (RDL), under bump metal (UBM), other dielectric materials might be disposed thereon as well. A bottom surface of the carrier is the surface opposite to the top surface. Therefore, a top surface of the WLP semiconductor structure is the surface toward the same direction as the top surface of the carrier.

A term "CTE" is used to represent coefficient of thermal expansion. The coefficient of thermal expansion describes how the size of an object changes with a change in temperature. Specifically, it measures the fractional change in size per degree change at around 25° C. at a constant pressure around 1 atm. The unit of CTE is ppm/° C., which stands for $10^{-6}$ m/m Celsius. In the present disclosure, CTE is particular dedicated to indicate the linear change. CTE of a material composed with a single element is substantially deemed as a constant. For example, silicon is 3 ppm/° C. and copper is 17 ppm/° C. For a compound material including multiple elements, such as glass or polymer, the CTE is in a range. Any CTE of a compound mentioned in the present disclosure should be interpreted only as a representative value and is not deemed as a limitation.

To a WLP semiconductor structure, warpage is avoided because the undesired curved top surface can affect the control of succeeding operations. In some cases, even though the WLP semiconductor structure has an unavoided warpage, a methodology to adjust or control the degree of curvature is still preferred. In the present disclosure, methods are used to improve the process control of a semiconductor structure. In the methods, a warpage of a WLP semiconductor structure is adjustable and the warpage of the WLP semiconductor structure is eliminated or controlled in a predetermined range. In some embodiments, the warpage of the WLP semiconductor structure is controlled to be in a desirable curvature by using several materials with different CTE during molding process in order to balance the stress in the WLP structure. In some embodiments, a WLP semiconductor structure has a substantially flat (zero curvature) top surface by implementing the methods Referring to FIG. 1, illustrated is a flowchart of a method 100 for fabricating a WLP semiconductor structure or a device with silicon semiconductor dies according to various aspects of the present disclosure. Referring also to FIGS. 2A to 2I, illustrated are different views of a WLP semiconductor structure or a device 200 at various stages of fabrication according to the method 100 of FIG. 1. It should be noted that part of the WLP semiconductor structure or a device 200 may be fabricated with a wafer level package process flow. Accordingly, it is understood that additional processes may be provided before, during, and after the method 100 of FIG. 1. It is understood that FIGS. 2A to 2I have been simplified for the clarity to better understand the inventive concepts of the present disclosure. The WLP semiconductor structure 200 or a device may be fabricated to become a fan-in or fan-out structure. Some metallization process may be implemented to form interconnections provided as communication signal traces of the semiconductor dies.

The method 100 includes operation 102 in which a carrier is provided. The method 100 continues with operation 104 in which several semiconductor dies are placed on a top surface of the carrier so as to cover a portion of the top surface. The method 100 continues with operation 106 in which a protrudent band is disposed on a periphery of the carrier. The method 100 continues with operation 108 in which a molding compound is formed on the carrier to cover the plurality of the semiconductor dies. In some embodiments, the semiconductor dies are active dies. Active dies are defined as dies different from non-functional dies, usually called "dummy dies" in the technical field. The active dies are fabricated to have electrical circuitry to perform a predetermined electrical function. On the contrary, dummy dies are not fabricated with same processes that apply on the active dies. Dummy dies do not perform any useful electrical function. The various operations of FIG. 1 are discussed below in more detail in association with cross sectional views corresponding to the operations of the flow diagram.

In FIG. 2A, the WLP semiconductor structure 200 includes a carrier 300. The carrier 300 is provided to carry semiconductor dies and other features for a WLP process. The carrier 300 has a top surface 302 on which the WLP semiconductor structure 200 is formed. For some embodiments as in FIG. 2B, a light to heat conversion film (LTHC) 301 is disposed on the surface 302 of the carrier 300. The LTHC 301 is decomposable after a heat, such as a laser heating, or thermal heating applied on the film 301 and the carrier 300 is thus removed from the structures attached thereon. In FIG. 2C, an adhesive 308 is disposed on the LTHC 301. In some embodiments, the adhesive 308 is a die attached film (DAF). In some embodiments, the DAF is electrical non-conductive and the DAF 308 is placed on the LTHC 301 by printing or spin coating. In some embodiments, the DAF is a film directly pasted on the LTHC 301. The DAF 308 includes various materials, such as resin filler. In some embodiments, the LTHC 301 has a thickness between about 0 um and about 10.0 um. In some embodiments, the DAF has a thickness between about 10 um to 50 um.

FIG. 2D is a perspective view of a band 325 which is provided in operation 106 of method 100. In some embodiments, as in FIG. 2D, the band 325 is a circular ring. In some embodiments, the band 325 has a rim 325-2, which is an outer surface of the band 325. The shape of rim 325-2 substantially follows the contour the carrier 300 in FIG. 2C. In other words, the rim 325-2 is designed to cover the edge of the carrier 300. For example, when the carrier 300 is in a circular shape, the rim 325-2 is also circular. Further, when the carrier has a diameter of 12 inches, the rim 325-2 is also a 12" wide ring. Therefore the rim 325-2 is designed to cover the perimeter of the carrier 300. In some embodiments, the carrier 300 is a polygon such as a pentagon, and the rim 325-2 is also in a pentagonal shape. Further, the rim 325-2 has an exact outline (size and shape) to match the edge profile of the pentagonal carrier 300. The band 325 also has a bottom surface 325-1 that is designed to be in contact with the DAF 308 in FIG. 2C. The bottom surface 325-1 complements the topography of the top surface around the edge of the carrier 300. For example, if the top surface of carrier edge is flat, the bottom surface 325-1 is a flat surface in order to be tightly sealed by the DAF 308. When the top surface of carrier edge is concave, the bottom surface 325-1 is convex in order to fit the concaved carrier edge. Similar, when he top surface of carrier edge is convex, the bottom surface 325-1 is concaved.

As in FIG. 2D, an inner edge 325-3 of the band 325 substantially follows the contour of the rim 325-2. When the rim 325-2 is in circular shape, the inner edge is also in circular shape. However, in some embodiments, the inner edge 325-3 has a different shape from the rim 325-2. For example, the inner edge 325-3 has an irregular shape instead of a circular shape. In some embodiments, the inner 325-3 has a tooth pattern while the rim 325-2 is in circular shape. The shape of rim 325-2 is substantially matching the profile of carrier edge. However, the shape of inner edge 325-3 is not constrained by the same rule. The design rules applied to the rim 325-2 and inner edge 325-3 are independent. In some embodiments, a factor to select the shape for the inner edge 325-3 is the layout of semiconductor dies disposed over the carrier 300 and the detail will be discussed later in the present disclosure.

The band 325 is disposed on the DAF 308 and a cross sectional view is shown in FIG. 2E. The band 325 is attached over the carrier 300 by the adhesives of DAF 308. The interface between band 325 and the DAF 308 is tightly sealed thus no gap exists. The band 325 has a height "h" that is protrudent from top surface of the DAF 308. In some embodiments, the band 325 acts as a retaining ring around the edge of the carrier 300. In some embodiments, the height h is between about 50 um and 780 um. In some embodiments, the height h is between about 200 um and about 600 um.

Figure 2F:
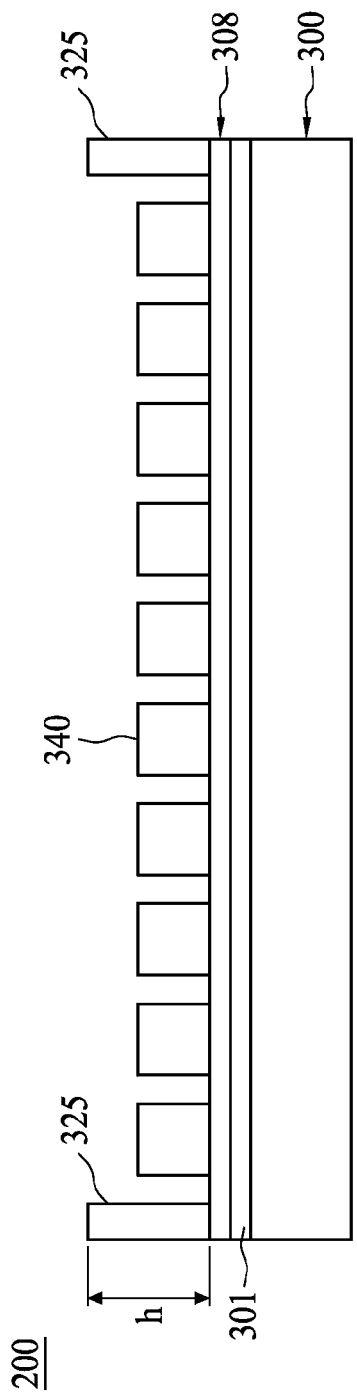
Figure 2G:
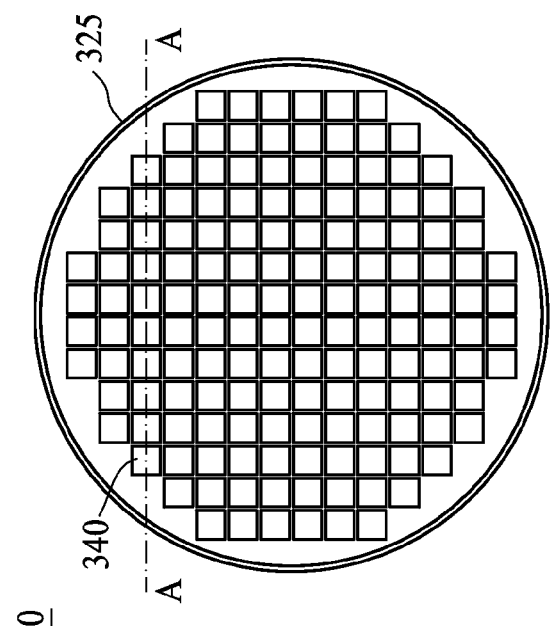

Active dies 340 are disposed over the carrier 300 as in FIG. 2F, which is a cross-sectional view along ling AA in FIG. 2G. In some embodiments, a semiconductor wafer is provided and singulated into several individual active dies and the individual active dies are picked and placed over the carrier 300. A portion of the top surface of the carrier 300 is covered by the active dies 340 as in FIG. 2F. Compared to the band 325, the active dies 340 are placed in a region more distant from the edge of the carrier 300.

In some embodiments, active dies 340 are disposed over the carrier 300 before the band 325 is disposed thereon. The active dies 340 are placed on the DAF 308 in a predetermined pattern before placing the band 325 over the carrier edge. The order of FIGS. 2E-2G should not be a limitation to the scope of present disclosure. In other words, sequence between the operation in FIG. 2E is interchangeable with the operation in FIG. 2F.

Figure 2H:
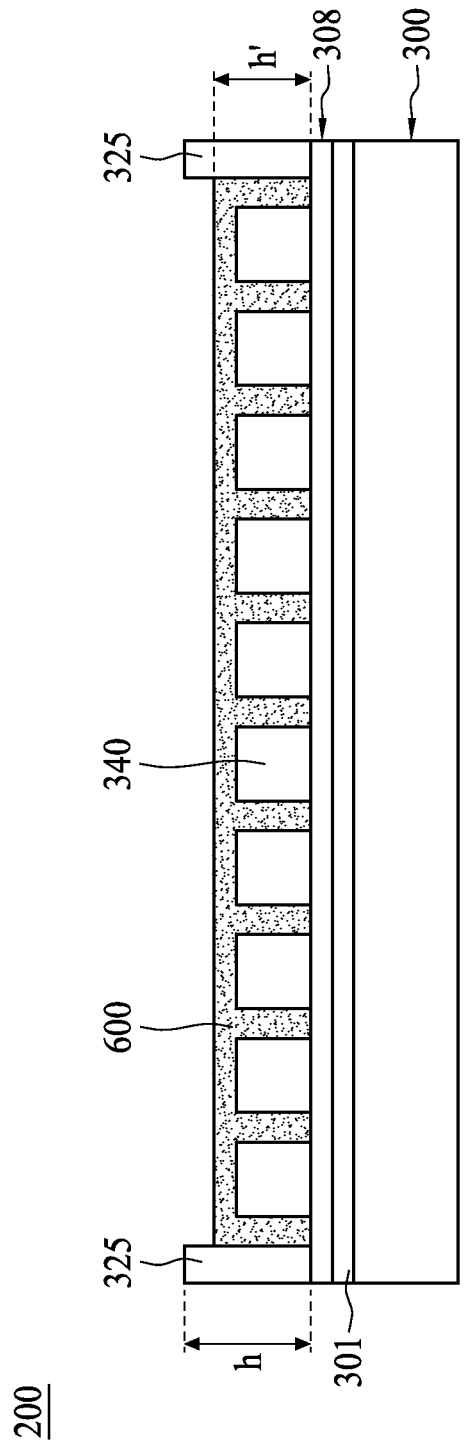
Figure 2H:
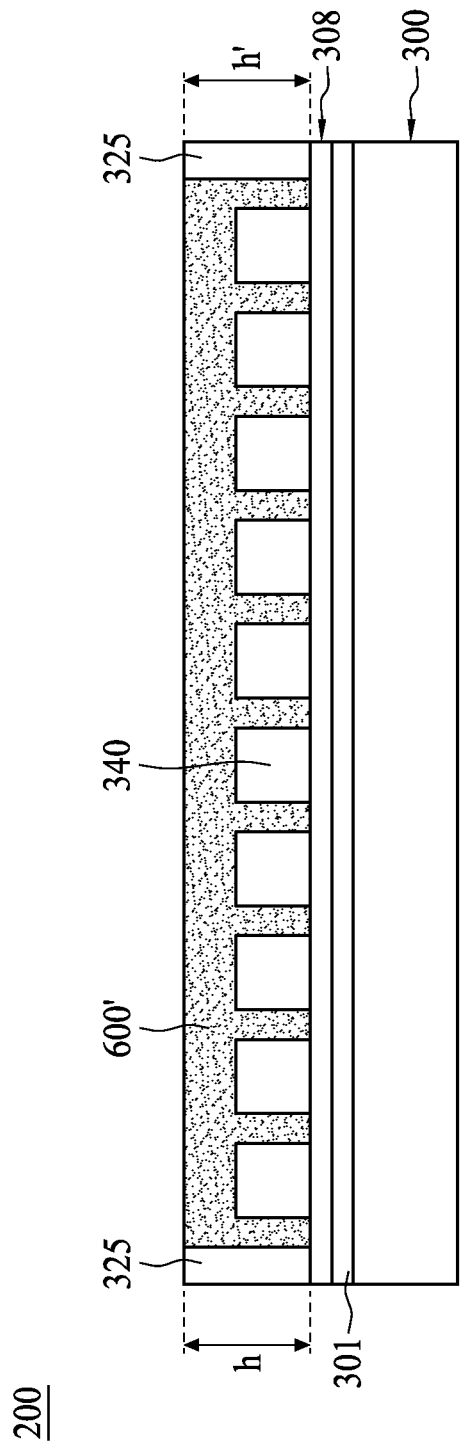

In FIG. 2H, a molding compound 600 is filled into a space inside band 325. The molding compound 600 is filled up to a height tall enough to cover the active dies 340. In some embodiments, the molding compound 600 is filled up to be about 10 um to 20 um taller than the height of active dies 340. Because the band 325 is tightly adhered on the DAF 308, the molding compound 600 does not leak through the interface between band 325 and DAF 308. In some embodiments, molding compound includes various materials, for example, one or more of epoxy resins, PBO, phenolic hardeners, silicas, catalysts, pigments, mold release agents, and the like. Material for forming a molding compound has a high thermal conductivity, a low moisture absorption rate, a high flexural strength at board-mounting temperatures, or a combination of these.

In some embodiments, molding compound 600 is dispensed over the carrier 300 in liquid phase. When a liquid molding compound (LMC) is adopted, overflow is avoided to ensure that there is no extra LMC flowing over the band 325. Thus, molding compound 600 is filled to a height h' which is less than the height h of the band 325. The height h' is tall enough to cover all active dies 340 thereby none of the active dies is exposed. For example, if the height of active die is "d", then height h' needs to be greater than d. Therefore, while forming molding compound over the carrier 300, a requirement, d<h'<h, should be met. In some embodiments, a factor to determine h' is to consider the CTE of the LMC 600. Because the filling operation is followed by a curing and the LMC 600 expands after cured. An estimated post cured height, for example, h'×(1+α), should be calculated before dispensing the LMC 600, wherein α is an linear expansion factor in accordance with the CTE of the LMC 600. In some embodiments as in FIG. 2H', h' is determined in order to have a post cured height, h'×(1+α), substantially equal to the height h of the band 325. Hence, a band 325 and the cured molding compound 600' altogether form a flat surface for proceeding operations. In some embodiments, the post cured height h'×(1+α) is designed to be less than h.

In addition to height h, another feature of the band 325 discussed herein is its CTE. The CTE of band 325 is selected in accordance with at least two factors, one factor is the CTE of each component constituting the WLP semiconductor structure and another factor is the pattern density of the active dies covering carrier 300. For example, in some embodiments, carrier 300 is glass consisting of silica. The CTE of carrier 300 is between about 3.0 ppm/° C. and about 8.0 ppm/° C. The variation of the CTE is from the difference of composition or crystalline form deviation of the glass. Active dies 340 are mainly made with silicon and having a CTE at about 3.0 ppm/° C. The CTE of molding compound 600 is greater than the CTE of carrier 300, for example, around 12.0 ppm/° C. If without the band 325, molding compound 600 is under a compressive stress post cured because there is a CTE mismatch between the molding compound and the carrier 300. Less expansion of carrier 300 constraints the molding compound 600 thus makes a warped WLP semiconductor structure. In the present example, the WLP semiconductor structure has a concave top surface (in view of molding compound on top). A band 325 with CTE at about 3.0 ppm/° C. is selected and disposed over the periphery of the carrier 300. Because the band 325 is at a same plane as the molding compound 600, CTE mismatch between the underlying carrier 300 and the molding compound 600 is abated by adding the band 325 around the molding compound. Therefore, warpage of the WLP semiconductor structure is alleviated. In some embodiments, band 325 includes materials such as quartz, silicon oxide, or silicon.

In another example, the CTE of carrier 300 is about 8.0 ppm/° C. Active dies 340 are mainly made with silicon and having a CTE at about 3.0 ppm/° C. The CTE of molding compound 600 is smaller than the CTE of carrier 300, for example, around 6.0 ppm/° C. If without the band 325, molding compound 600 is under a tensile stress because there is a CTE mismatch between the molding compound 600 and the carrier 300. Larger expansion of carrier 300 strains the molding compound 600 and makes a warped WLP semiconductor structure. In the present example, the WLP semiconductor structure has a convex top surface (in view of molding compound on top). A band 325 with CTE at about 7.0 ppm/° C. is selected and disposed over the periphery of the carrier 300. Because the band 325 is at a same plane as the molding compound 600, CTE mismatch between the underlying carrier 300 and the molding compound 600 is abated by adding the band 325 around the molding compound 600. Therefore, warpage of the WLP semiconductor structure is alleviated. In some embodiments, band 325 is a second type molding compound that has a CTE greater than the CTE of molding compound 600.

Thus, in the present disclosure, while the CTE of carrier 300 is smaller than the CTE of molding compound 600, a band with a CTE smaller than the CTE of molding compound 600 is selected to be disposed over periphery of the carrier 300. In some embodiments, the CTE of band 325 is substantially equal to the CTE of carrier 300. In some embodiments, when the CTE of carrier 300 is greater than the CTE of molding compound 600, a band 325 with a CTE greater than the CTE of molding compound 600 is selected to be disposed over periphery of the carrier 300 for stress balancing.

Another advantage of introducing the band over the carrier is that the band is attached over the carrier by the DAF, therefore, the band is detachable. In some embodiments, the band is removed from the WLP semiconductor structure prior to a singulation operation. Thus, the removed band is saved and reused in another WLP semiconductor structure before forming molding compound over a carrier. The design of a detachable stress adjustment band reduces manufacturing cost because it can be recycled for different WLP semiconductor structure with a same size. Additionally, there is no lead time required to produce a new band so as to improve the manufacturing efficiency.

Figure 2I:
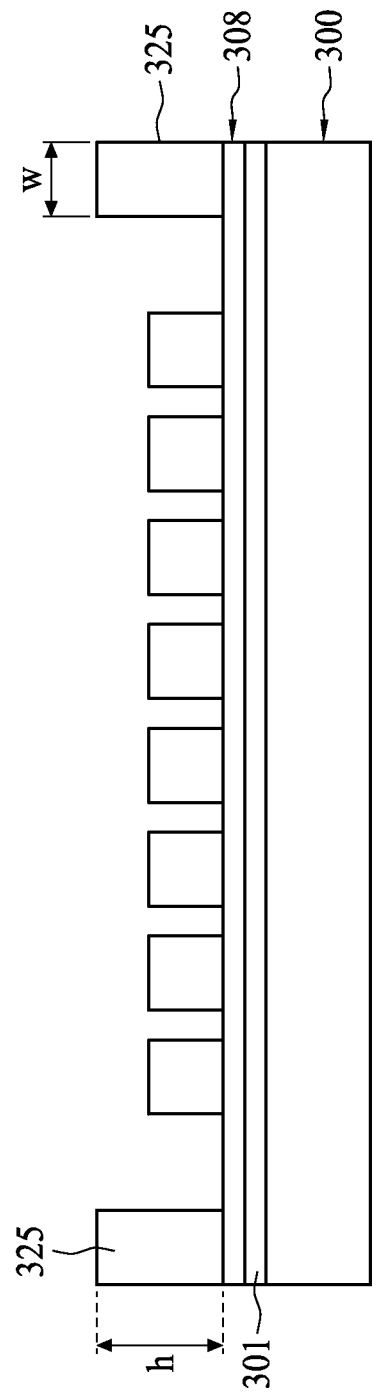

The band 325 also has another feature, width "w", as illustrated in FIG. 2I. The width w is determined by several factors such as the degree of CTE mismatch between components constituting the WLP semiconductor structure, active die pattern density over the carrier, or size of the active die. For example, if the CTE mismatch between the carrier and the molding compound is over 3 ppm/° C., a larger width w is designed to abate the warpage. In another example, when the active die pattern density is over 90%, the width is designed to be between about 5 mm and about 10 mm. In still another example, when the size of active die is 20 mm×20 mm, the width is designed to be between about 8 mm and about 18 mm. In some embodiments, width w is between about 2 mm and about 18 mm. In some embodiments, width w is between about 5 mm and about 15 mm.

Figure 3:
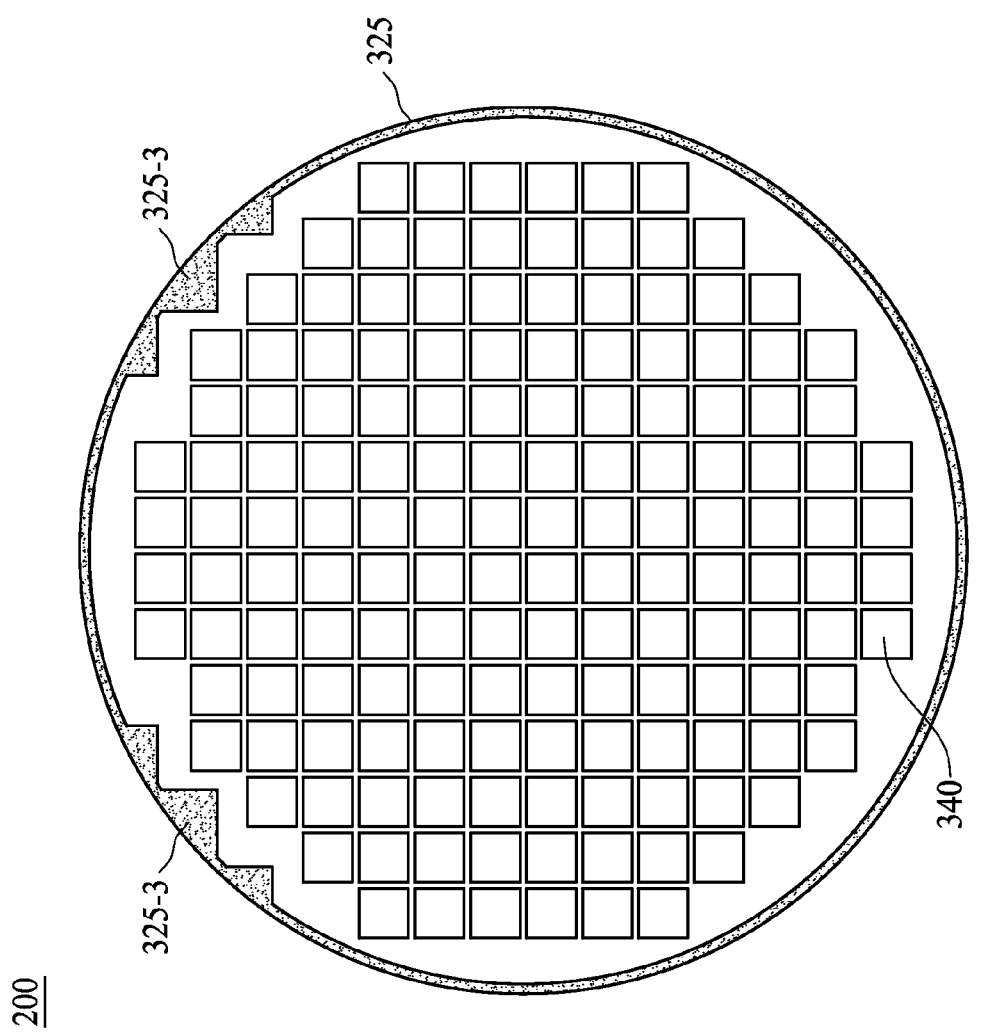
FIG. 3 is a top view of a semiconductor device having a zigzag edge band in accordance with some embodiments of the present disclosure.

FIG. 3 is a top view showing the layout of active dies 340 over a carrier. In some embodiments, the width w is not uniform and the inner edge of band 325 is customized to have various patterns. The inner edge 325-3 of band 325 has a zigzag pattern. The zigzag pattern 325-3 is designed to substantially follow the layout of active dies 340. Because the distribution of edge dies are not in a circular shape, the inner edge 325-3 of band 325 is designed to have a zigzag pattern 325-1 in order to cover more areas that are not occupied by active dies 340. In some embodiments, the area coverage ratio over the carrier by the band 325 is between about 6% and about 20%. In some embodiments, the area coverage ratio over the carrier by the band 325 is between about 6.6% and about 19%.

By disposing a band or ring over a periphery of a carrier in a WLP semiconductor structure, the surface warpage is adjusted to have a desirable curvature. In some embodiments, the top surface of a finished WLP semiconductor structure (with molding compound and cured) is substantially flat after adding a band on the periphery of the carrier. In some embodiments, a WLP semiconductor structure's warpage is changed from a concave top surface (or called smile warpage) to a substantially flat surface.

In some embodiments, warpage of the WLP semiconductor structure or the device is adjusted by forming a ring of a molding compound over periphery of the carrier. The second molding compound has a different CTE from another molding compound formed over a central region of the carrier. Therefore, there are at least two different molding compounds are included in the WLP semiconductor structure. The molding compound located at the periphery is designed to balance the CTE mismatch between another molding compound which is located at the central region and the carrier.

In the present disclosure, a concave WLP semiconductor structure warpage is defined as a negative curvature (or crying face), and a convex WLP semiconductor structure warpage is defined as a positive curvature (or smiling face). Zero curvature means the top surface of WLP semiconductor structure is flat. In some embodiments, a WLP semiconductor structure has a warpage between about 300 um and 600 um.

Figure 4:
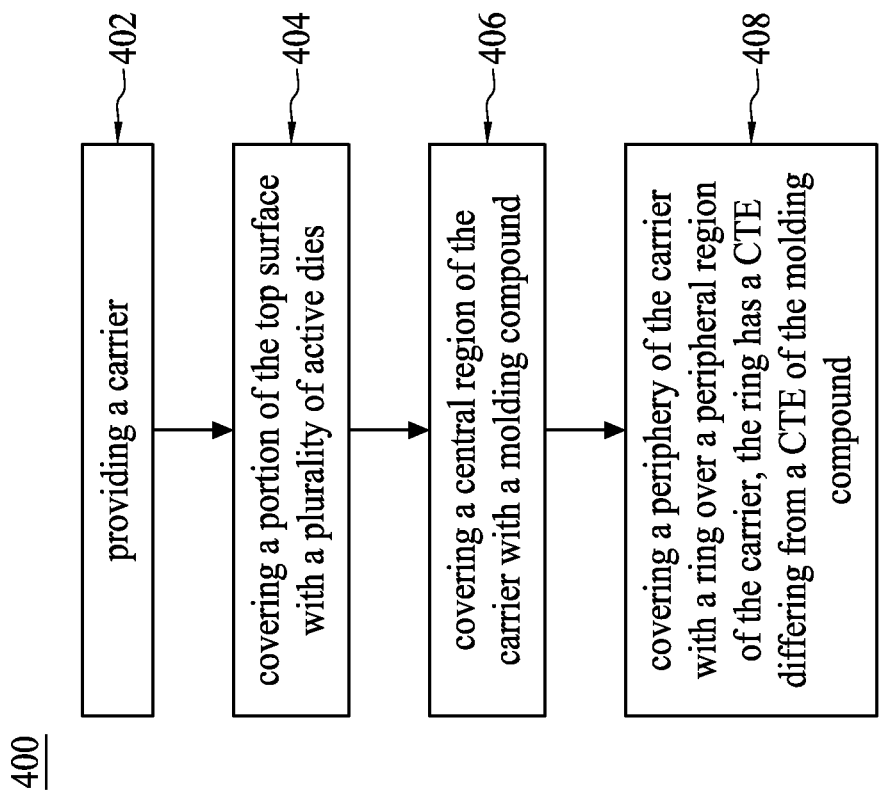
FIG. 4 is a flow diagram of a method of manufacturing a semiconductor device in accordance with some embodiments of the present disclosure.

According to various aspects of the present disclosure, a flow chart of a method 400 referring to FIG. 4 is illustrated fabricating a WLP semiconductor structure or a device with multiple molding compounds that differ in CTE. In the WLP semiconductor structure, one molding compound is formed as a ring on a peripheral region of a carrier. In some embodiments, the molding compound ring is a protrudent band around the edge of the carrier. Referring also to FIGS. 5A to 5G, illustrated are different views of a WLP semiconductor structure or a device 500 at various stages of fabrication according to the method 400 of FIG. 1. It should be noted that part of the WLP semiconductor structure 500 may be fabricated with a wafer level package process flow. Accordingly, it is understood that additional processes may be provided before, during, and after the method 400 of FIG. 4. It is understood that FIGS. 5A to 5G have been simplified for the clarity to better understand the inventive concepts of the present disclosure. Similar to the WLP semiconductor structure 200 in aforementioned embodiments, the WLP semiconductor structure or device 500 may be fabricated in a fan-in or fan-out process. Some metallization process may be implemented to form interconnections provided as communication signal traces of the semiconductor dies.

The method 400 includes operation 402 in which a carrier is provided. The carrier has a top surface. The method 400 continues with operation 404 in which several semiconductor dies are placed over the top surface of so as to cover a portion of the top surface. The method 400 continues with operation 406 in which a central region of the top surface with a molding compound. The method 400 continues with operation 408 in which a ring with a different CTE from the molding compound is formed over a peripheral region of the carrier. The various operations of FIG. 4 are discussed below in more detail in association with cross sectional views corresponding to the operations of the flow diagram.

Figure 5A:
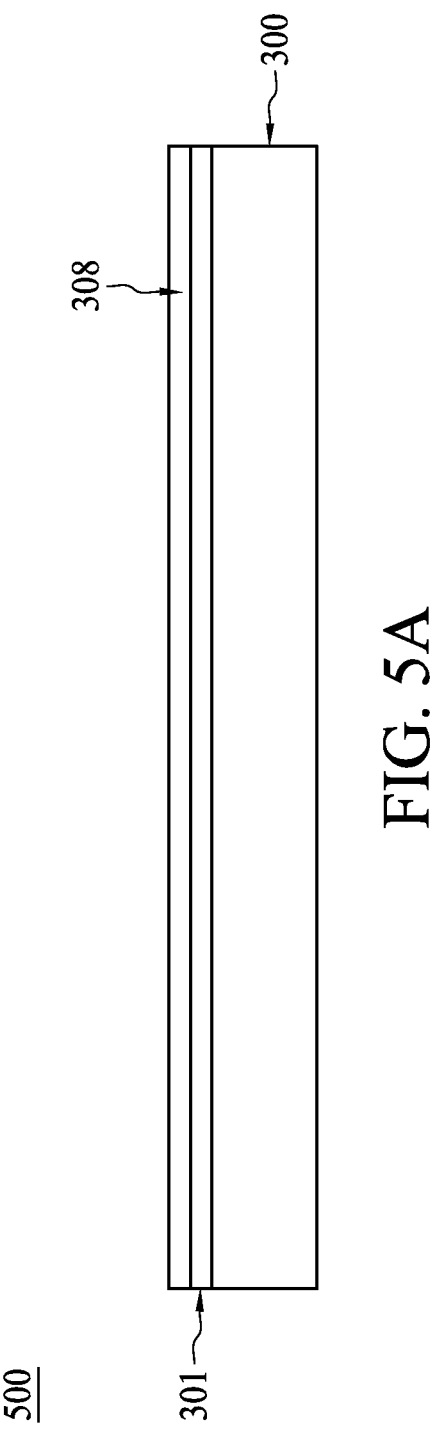
FIGS. 5A to 5G are illustrations of a semiconductor device in various stages corresponding to the method of FIG. 4 in accordance with some embodiments of the present disclosure.
Figure 5B:
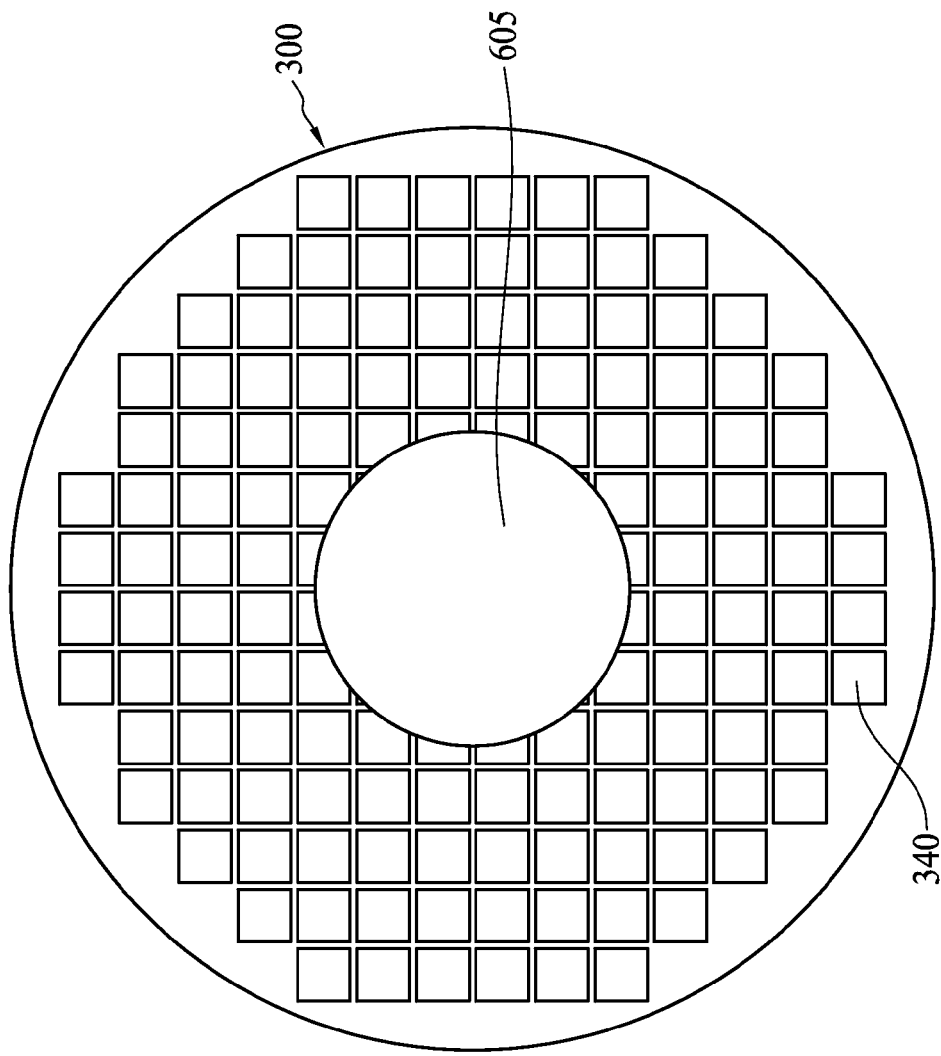
Figure 5C:
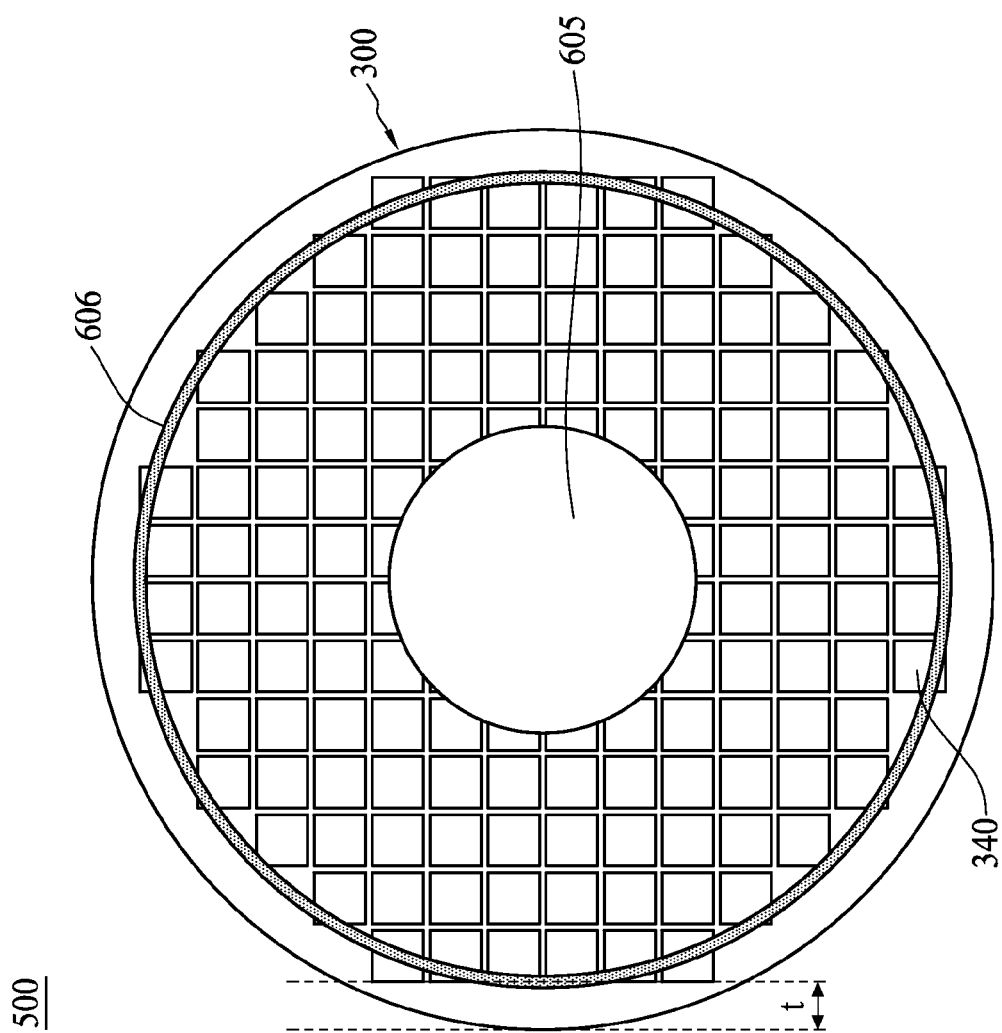

In FIG. 5A, a WLP semiconductor structure 500 is provided to have a LTHC 301 and a DAF 308 over a carrier 300. The detail of operations and materials to form the LTHC 301 and DAF 308 is referred to descriptions corresponding to FIGS. 2A-2C and is not repeated herein. FIG. 5B is a top view of the WLP semiconductor structure 500 in one stage of the manufacturing method 400. In the current stage, a molding compound 605 with a first CTE is dispensed over the central region of carrier 300. In some embodiments, the molding compound 605 is dispensed as a liquid droplet over the carrier 300. A portion of the active dies 340 (particularly around the center of carrier 300) are covered by the molding compound 605. In FIG. 5C, another molding compound 606 is disposed over carrier 300. Molding compound 606 is disposed in a circular ring shape. In some embodiments, there is a gap t between molding compound 606 and the edge of carrier 300. The gap t is reserved to be a space for allowing molding compound 606 extending to the edge of carrier 300 after a curing operation. In some embodiments, the curing operation includes a thermal setting process.

Figure 5D:
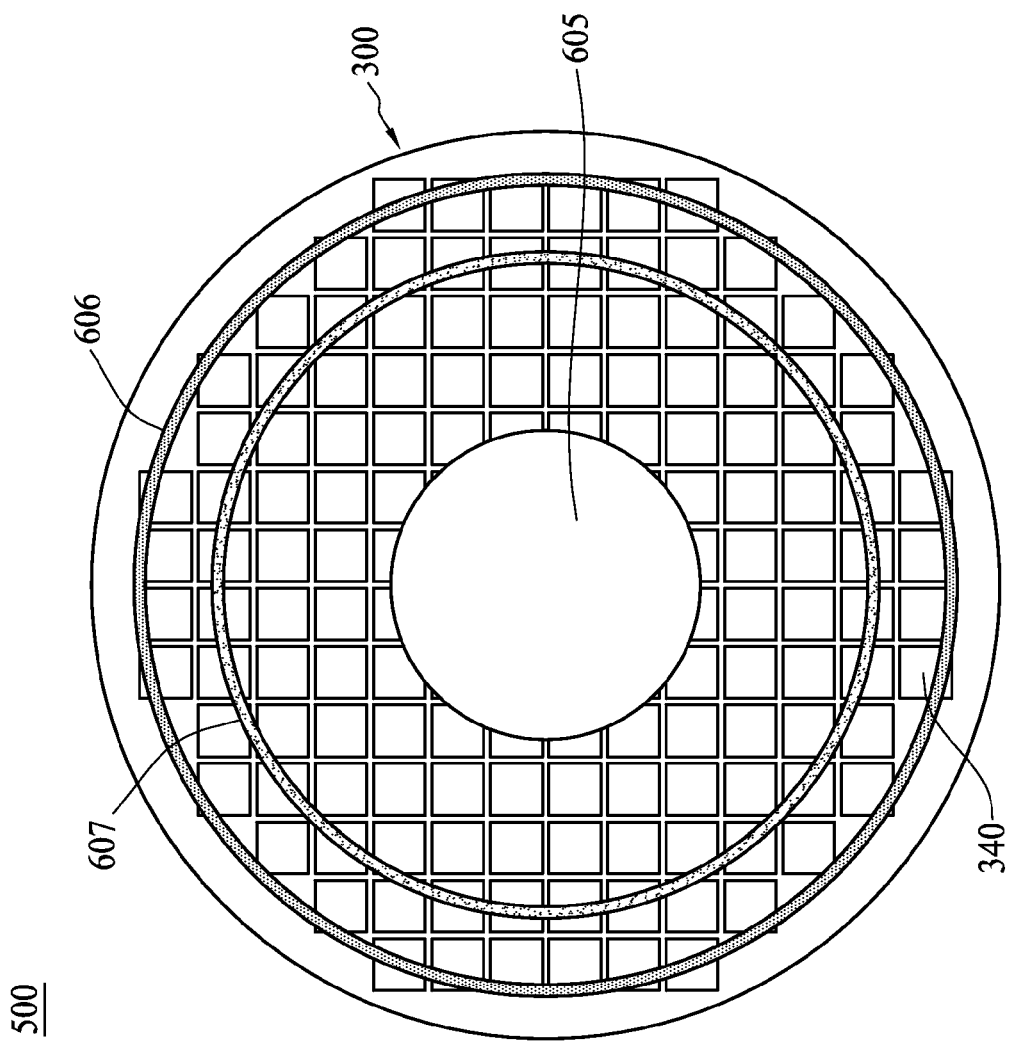

In some embodiments, a third molding compound ring 607 is dispensed between molding compounds 605 and 606 as illustrated in FIG. 5D. The CTE of the third molding compound 607 is between the CTE of molding compound 605 and the CTE of molding compound 606. In some embodiments, the CTE of the third molding compound 607 is greater than the CTE of the molding compound 605 and smaller than the CTE of the molding compound 606. For example, the molding compound 605 has a CTE around 7 ppm/° C. and the molding compound 605 has a CTE around 9 ppm/° C., thus the molding compound 607 has a CTE between about 7 ppm/° C. and 9 ppm/° C. In some embodiments, there are several molding compound rings with different CTE are dispensed between molding compound 605 and 606, then a molding compound bulk with a gradient CTE is formed on over the carrier 300. In some embodiments, the CTE increases with a distance from the center of carrier 300. In some embodiments, the CTE increases with a distance from the edge of carrier 300.

In some embodiments, molding compound over the center of carrier has the lowest CTE and molding compound over the periphery of carrier has the highest CTE.

In some embodiments, the carrier 300 is a glass with a CTE around 4.5 ppm/° C. A molding compound 605 is selected to have a CTE about 6.0 ppm/° C. and disposed on a central region as in FIG. 5C. A molding compound ring 606 having a CTE about 9.0 ppm/° C. is disposed over a periphery region of the carrier 300.

Figure 5E:
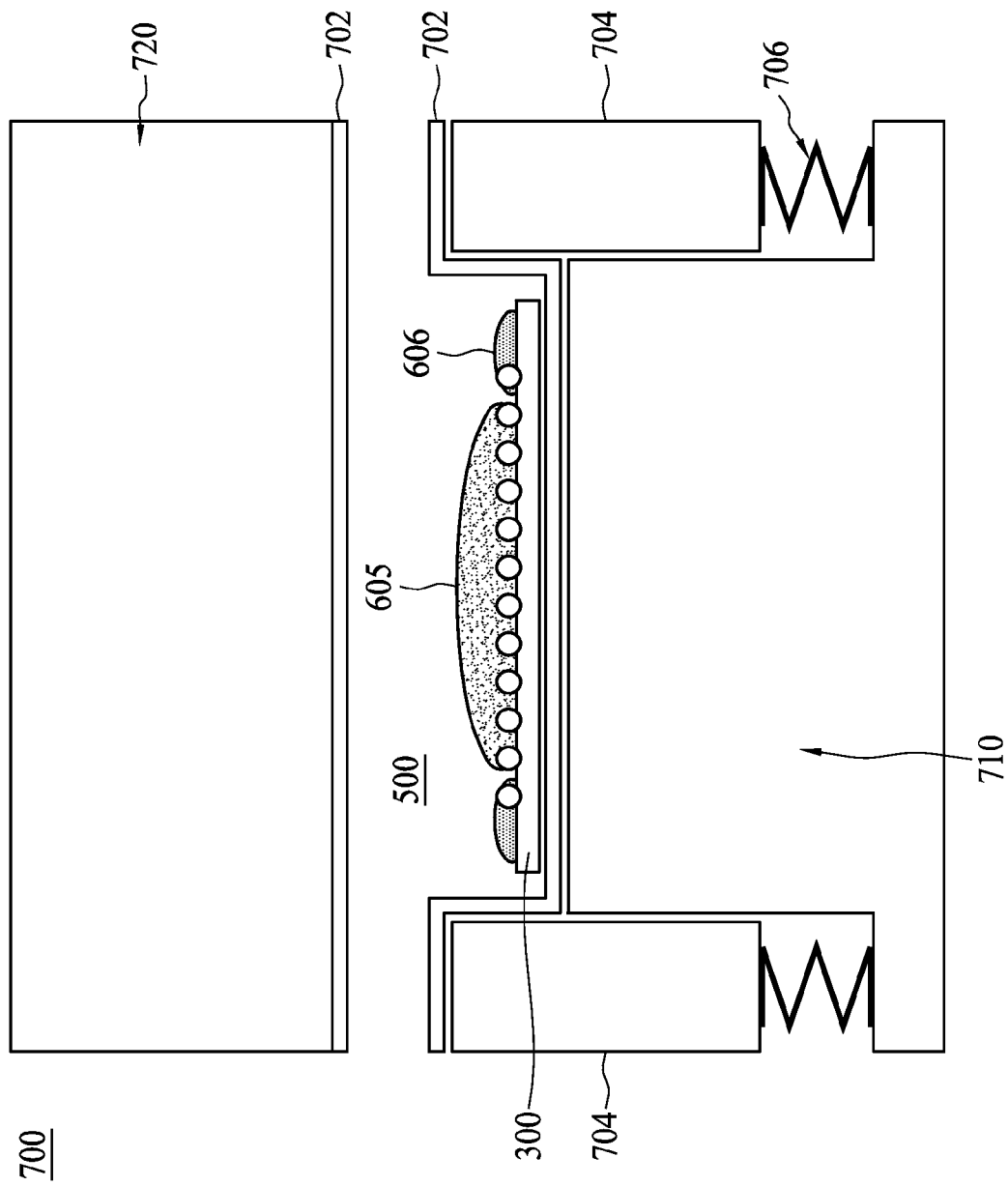
Figure 5F:
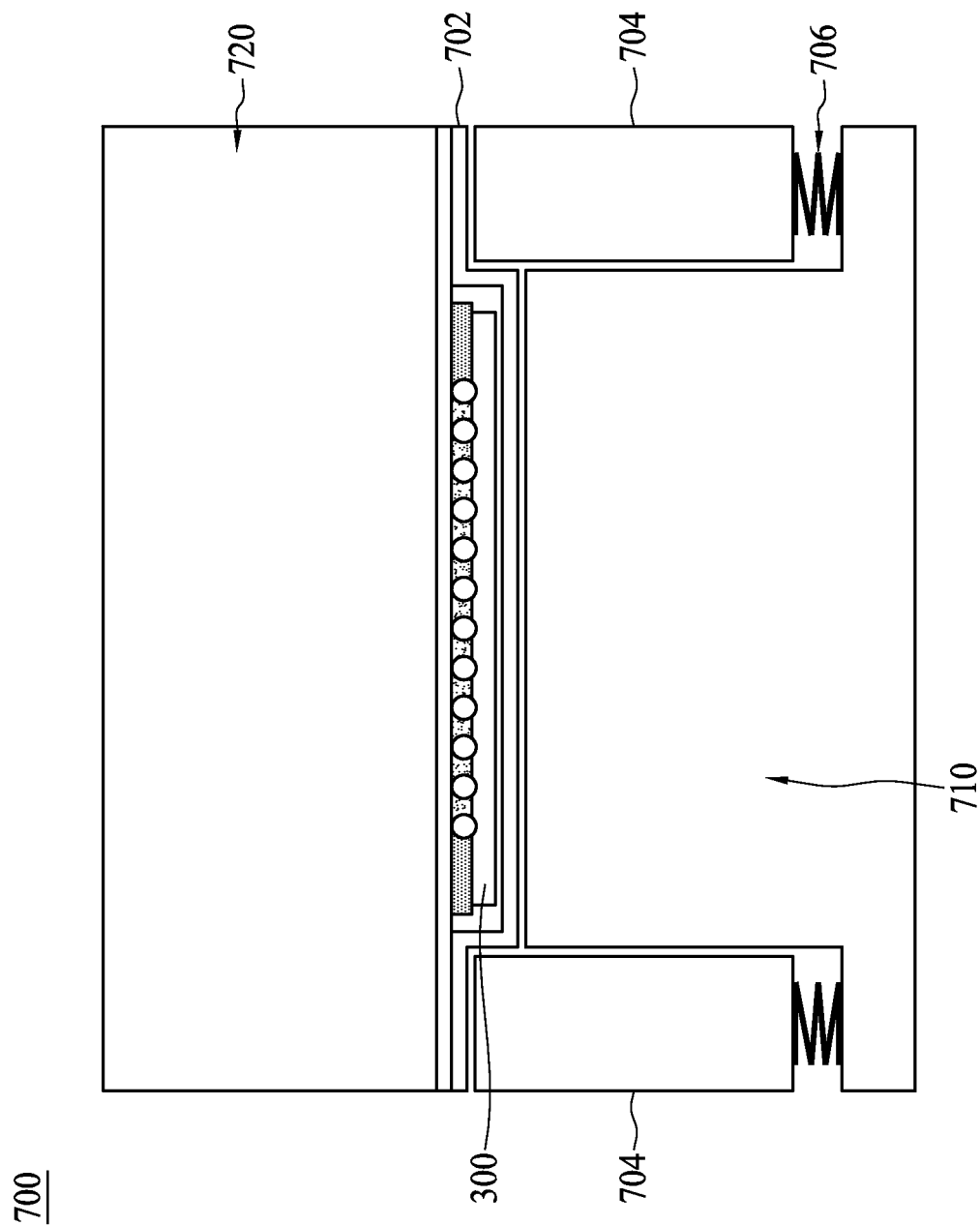

FIG. 5E is a cross sectional view illustrating an operation of thermal setting. A WLP semiconductor structure 500 is disposed inside a thermal setting equipment 700. The WLP semiconductor structure 500 is placed on a surface of a bottom mold 710 of the thermal setting equipment 700. The carrier 300 is on a protection layer 702. The protection layer 702 protects surfaces of the bottom mold 710 from being contaminated during thermal setting operation. Equipment 700 has a cylinder 704 coupled to a spring 706. When the upper mold 720 is lowered down to push the bottom mold 710, spring 706 is pressed and the cylinder 704 sinks down to have the upper mold 720 press molding compounds 605 and 606. As in FIG. 5F, molding compound 605 and 606 are pressed by the upper mold 710 and cover whole area of the carrier 300. A heating process is introduced while the molding compound is pressed.

Figure 5G:
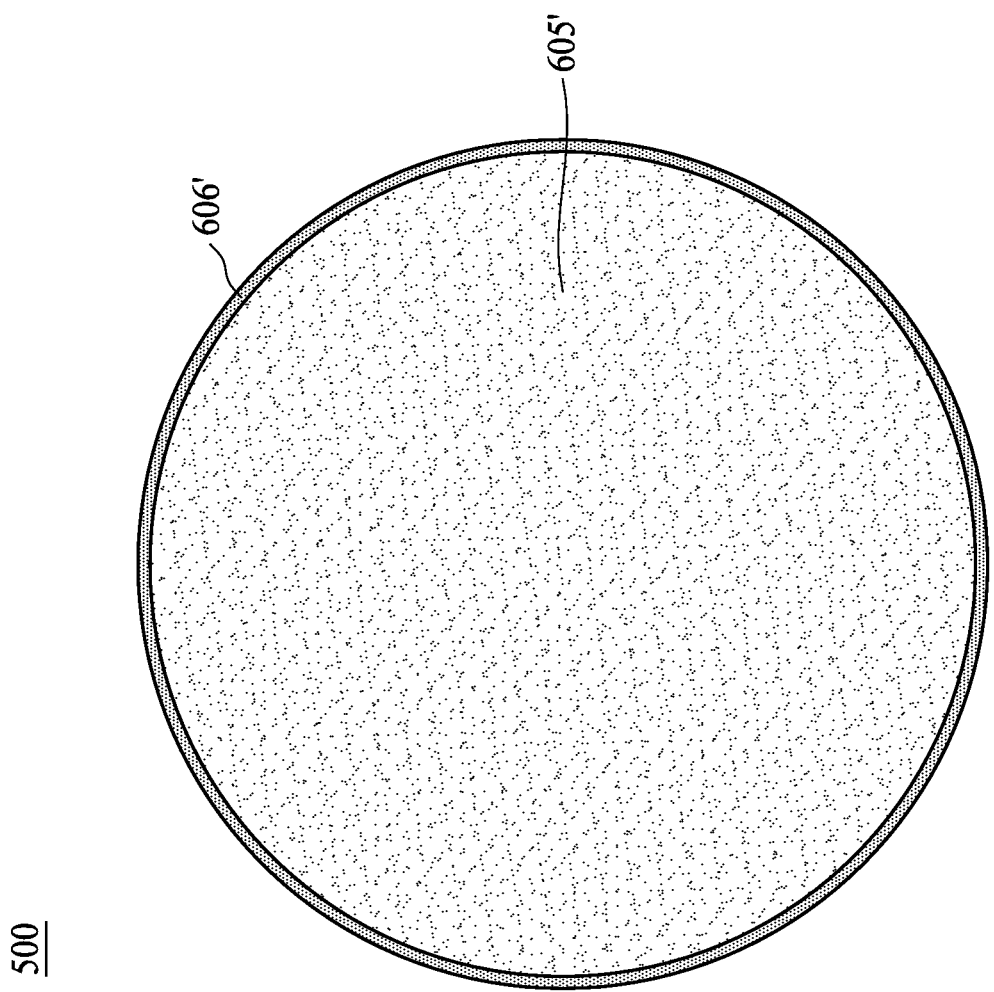

FIG. 5G is a top view of the WLP semiconductor structure 500 after the thermal setting operation. The WLP semiconductor structure 500 has a molding compound ring 606' disposed on the edge of the WLP semiconductor structure 300 and a molding compound circle 605' surrounded by molding compound ring 606'. The CTE of molding compound ring 606' is different from the CTE of molding compound circle 605'.

Figure 6:
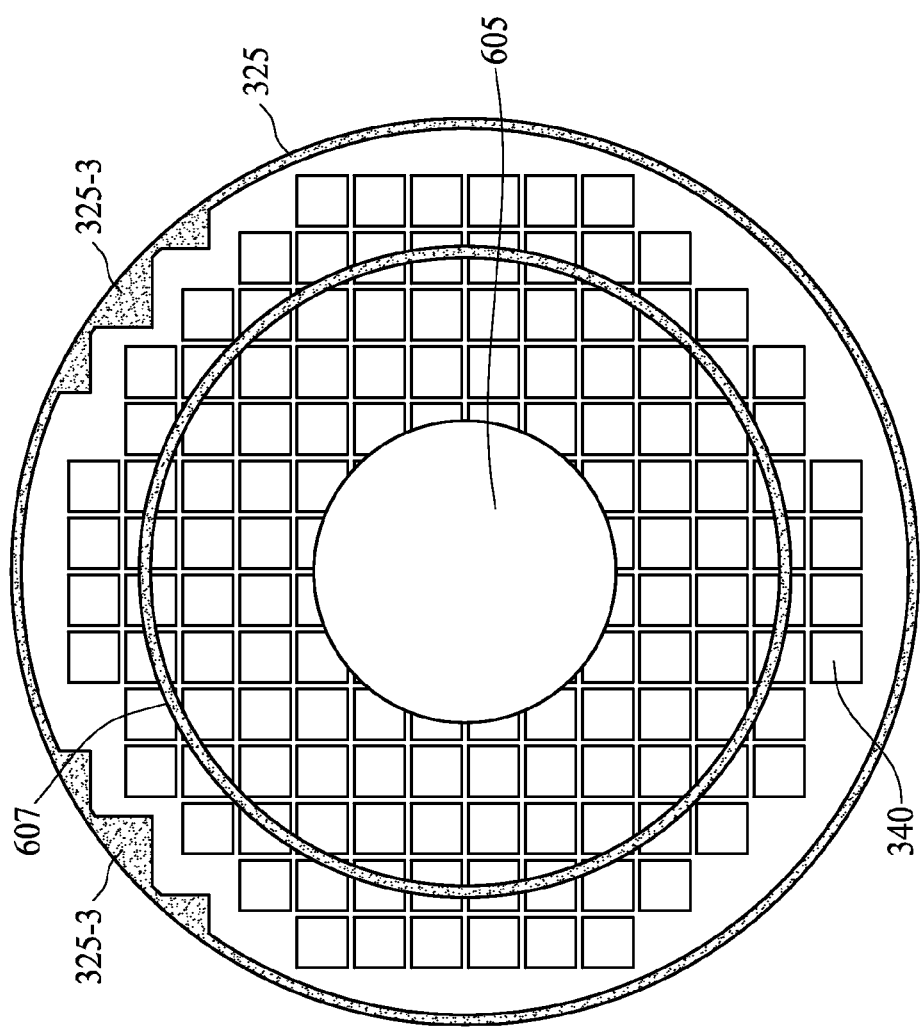
FIG. 6 is a top view of a semiconductor device having a zigzag edge band and two different molding compounds in accordance with some embodiments of the present disclosure.

In some embodiments, a method of manufacturing a WLP semiconductor structure includes some operations of method 100 and some operations of method 400. As in FIG. 6, a protrudent band 325 is provided to cover periphery of the carrier. A first molding compound 605 is over a central region of the carrier and a second molding compound 607 is disposed between the first molding compound 605 and the protrudent band 325. The first molding compound 605 has a first CTE and the second molding compound 607 has a second CTE. The second CTE is between the CTE of the protrudent band 325 and the first CTE. A thermosetting operation is performed as in FIG. 5F. After the thermosetting operation, the WLP semiconductor structure has a CTE gradient top layer. In some embodiments, the first CTE is greater than the second CTE, therefore the CTE decreases with a distance from the center of the carrier. In some embodiments, the first CTE is smaller than the second CTE, therefore the CTE decreases with a distance from the edge of the carrier.

Figure 7:
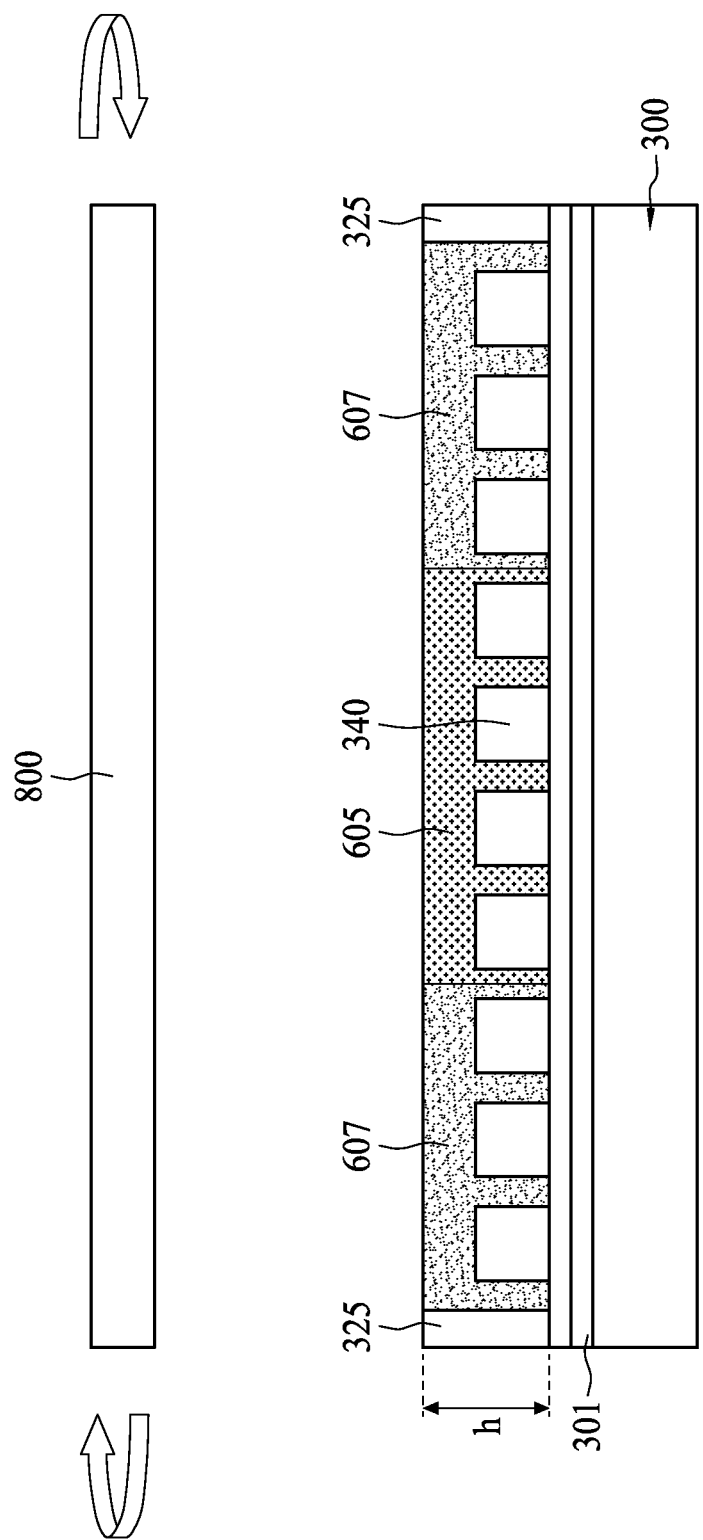
FIG. 7 is a cross sectional view of a semiconductor device under a grinding operation in accordance with some embodiments of the present disclosure.

In some embodiments, a top lapping operation is performed to grind the first and second molding to a substantially same level as in FIG. 7 by a grinder 800. In some embodiments, the first and second molding compounds are ground to a same height as the protrudent band, therefore the top surface of the WLP semiconductor structure is a substantially flat surface.

By following the method 100 or 400 and their corresponding drawings, warpage of a WLP semiconductor structure is effectively abated and adjusted to a desired profile. The CTE mismatch between a carrier and a molding compound disposed thereon is balanced by disposing a structure with a CTE differing to the molding compound over a periphery region of the carrier.

In some embodiments, a method of manufacturing a device includes several operations. One of the operations is providing a carrier and the carrier includes a top surface. One of the operations is covering a portion of the top surface with a plurality of active dies. One of the operations is disposing a protrudent band on a periphery of the carrier, wherein the protrudent band includes a rim shaped along the contour of the carrier. One of the operations is forming a molding compound on the carrier to cover the plurality of active dies.

In some embodiments, the method includes gluing the protrudent band on the periphery of the top surface with an adhesive.

In some embodiments, the protrudent band includes a CTE smaller than a CTE of the molding compound.

In some embodiments, the protrudent band includes quartz, silicon oxide, or silicon. In some embodiments, the protrudent band includes a width ranges about 2 mm to about 18 mm. In some embodiments, the protrudent band is preformed before being disposed on the periphery of the carrier. In some embodiments, the protrudent band includes an inner edge with a zigzag pattern.

In some embodiments, the molding compound is retained within the protrudent band. In some embodiments, the molding compound includes a same height with the protrudent band.

In some embodiments, a method of manufacturing a device includes several operations. One of the operations is providing a carrier including a top surface. One of the operations is covering a portion of the top surface with a plurality of active dies. One of the operations is covering a central region of the carrier with a molding compound, wherein a portion of the plurality of active dies are under the molding compound. One of the operations is covering a periphery of the carrier with a ring over a peripheral region of the carrier, wherein the material has a CTE differs from a CTE of the molding compound.

In some embodiments, the method includes an operation of performing a curing on the molding compound and the ring so as to extend the coverage of the molding compound and the ring.

In some embodiments, the method includes an operation of covering a portion of the plurality of active dies with a second molding compound, wherein the second molding compound is between the molding compound, and CTE of the second molding compound is between the CTE of the molding compound and the CTE of the ring.

In some embodiments, the CTE of the ring is greater than the CTE of the molding compound.

In some embodiments, a method of manufacturing a device includes several operations. One of the operations is providing a carrier, the carrier including a top surface. One of the operations is covering a portion of the top surface with a plurality of active dies. One of the operations is disposing a protrudent band over a periphery of the carrier, wherein the protrudent band includes a rim shaped along the contour of the carrier. One of the operations is forming a first molding compound with a first CTE over a central region of the carrier to cover the plurality of active dies.

In some embodiments, a method of manufacturing a device includes forming a second molding compound between the protrudent band and the first molding compound, wherein the second molding compound has a second CTE, and the second CTE is between the first CTE and the protrudent band.

In some embodiments, a method of manufacturing a device, wherein the protrudent band includes a CTE smaller than a CTE of the molding compound second CTE is greater than the first CTE.

In some embodiments, a method of manufacturing a device, wherein the second CTE is smaller than the first CTE.

In some embodiments, a method of manufacturing a device includes, wherein the protrudent band includes quartz, silicon oxide, or silicon further comprising performing a thermal setting operation to mold the first molding compound and the second molding compound.

In some embodiments, a method of manufacturing a device includes grinding the first molding compound and the second molding compound to be at a same level, and the first molding compound and the second compound form a substantially flat surface with the protrudent band.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method of manufacturing a device, comprising:
providing a carrier including a top surface;
covering a portion of the top surface with a plurality of active dies;
covering a central region of the carrier with a molding compound, wherein a first portion of the plurality of active dies are under the molding compound; and
covering a periphery of the carrier with a periphery molding compound over a peripheral region of the carrier, the periphery molding compound has a CTE differing from a CTE of the molding compound, and wherein a second portion of the plurality of active dies are under the periphery molding compound,
wherein the first portion of the plurality of active dies is a first predetermined set of the plurality of the active dies, and the second portion of the plurality of active dies is a second predetermined set of the plurality of the active dies other than the first predetermined set of the plurality of the active dies.

2. The method of claim 1, wherein the CTE of the periphery molding compound is greater than the CTE of the molding compound.

3. The method of claim 1, further comprising performing a curing on the molding compound and the periphery molding compound so as to extend the coverage of the molding compound and the periphery molding compound.

4. The method of claim 1, further comprising covering a third portion of the plurality of active dies with a third molding compound, wherein the third molding compound is between the molding compound and the periphery molding compound, and CTE of the third molding compound is between the CTE of the molding compound and the CTE of the periphery molding compound.

5. The method of claim 4, further comprising performing a thermal setting operation to mold the molding compound and the third molding compound.

6. The method of claim 4, further comprising grinding the molding compound and the third molding compound to form a substantially flat surface.

7. The method of claim 4, wherein CTE of the periphery molding compound is greater than the CTE of the molding compound and the CTE of the third molding compound.

8. The method of claim 1, wherein the CTE of the periphery molding compound is between about 3.0 ppm/° C. and about 8.0 ppm/° C.

9. The method of claim 1, wherein the periphery molding compound includes a width ranges about 2 mm to about 18 mm.

10. The method of claim 1, wherein the molding compound is retained within the periphery molding compound.

11. The method of claim 1, wherein the molding compound and the periphery molding compound comprises a coplanar surface.

12. The method of claim 1, further comprising performing a thermal setting operation to mold the molding compound and the periphery molding compound.

13. The method of claim 12, further comprising grinding the molding compound and the periphery molding compound to be at a same level.

14. The method of claim 1, further comprising covering a third portion of the plurality of active dies with a third molding compound, wherein the third molding compound is between the molding compound and the periphery molding compound, and wherein the CTE of the periphery molding compound is smaller than the CTE of the molding compound and the CTE of the third molding compound.

15. A method of manufacturing a device, comprising:
providing a carrier including a top surface;
covering a portion of the top surface with a plurality of active dies;
covering a central region of the carrier with a molding compound, wherein a portion of the plurality of active dies are under the molding compound;
covering a periphery of the carrier with a ring over a peripheral region of the carrier;
performing a thermal setting operation to mold the molding compound and the ring; and
forming a continuous molding compound with gradient CTE along the radial direction of the carrier;
wherein the ring has a CTE differing from a CTE of the molding compound.

* * * * *